United States Patent
Lin et al.

(10) Patent No.: US 6,812,503 B2
(45) Date of Patent: Nov. 2, 2004

(54) LIGHT-EMITTING DEVICE WITH IMPROVED RELIABILITY

(75) Inventors: Ming-Der Lin, Hsinchu (TW); Kwang-Ru Wang, Chiai (TW)

(73) Assignee: Highlink Technology Corporation, Hsinchu (TW)

( * ) Notice: Subject to any disclaimer, the term of this patent is extended or adjusted under 35 U.S.C. 154(b) by 0 days.

(21) Appl. No.: 10/304,702

(22) Filed: Nov. 27, 2002

(65) Prior Publication Data

US 2003/0098651 A1 May 29, 2003

(30) Foreign Application Priority Data

Nov. 29, 2001 (TW) .......................................... 90129464 A

(51) Int. Cl.[7] .............................................. H01L 33/00
(52) U.S. Cl. ............................ 257/99; 257/98; 257/100
(58) Field of Search .............................. 257/98, 99, 100

(56) References Cited

U.S. PATENT DOCUMENTS 6,340,824 B1 * 1/2002 Komoto et al. ............... 257/99

* cited by examiner

*Primary Examiner*—Jerome Jackson
(74) *Attorney, Agent, or Firm*—Rosenberg, Klein & Lee

(57) ABSTRACT

The present invention discloses a light-emitting device with improved reliability so as to achieve a prolonged lifetime, better stability and excellent illumination quality. The light-emitting device comprises a substrate; a light-emitting component, having a p-n junction, mounted on a top surface of the substrate so as to be connected to corresponding metal pads through at least one conducting wire; and a cap, formed of a transparent material to have an inward concave, wherein the light-emitting component is disposed in the inward concave such that there is a gap between the light-emitting component and the cap.

15 Claims, 3 Drawing Sheets

LIGHT-EMITTING DEVICE WITH IMPROVED RELIABILITY

BACKGROUND OF THE INVENTION

1. Field of the Invention

The present invention generally relates to a light-emitting device and, more particularly, to a light-emitting device with improved reliability so as to achieve a prolonged lifetime, better stability and excellent illumination quality.

2. Description of the Prior Art

The light-emitting diode (to be abbreviated as LED hereinafter) has received considerable attention for its advantages such as long lifetime, small size, low heat generation, low power consumption, high response speed, monochromic lighting ability, etc. and has been widely used in applications such as computer peripherals, clock displays, display panels, traffic signs, and many other 3C (computer, communication and consumer) products since the 1960s. Therefore, the LED has become one of the most important light sources.

To implement a white light source by emitting monochromatic lights of various wavelengths (more particularly, red, green and blue lights), there have been disclosed lots of new techniques such as U.S. Pat. No. 5,998,925 entitled "Light emitting device having a nitride compound semiconductor and a phosphor containing a garnet fluorescent material" filed by Yoshinori Shimizu, et al (Nichia, J P) and U.S. Pat. No. 5,962,971 entitled "LED structure with ultraviolet light emission chip and multilayered resins to generate various colored lights" filed by Hsing Chen. (TW). In these aforementioned patent applications, a light-emitting component is sited in a cap formed of epoxy resin, in which there are also provided with a filler formed of a fluorescent material, resin, epoxy resin and polymer surrounding the light-emitting component so as to absorb light of a first color. The wavelength of light of the first-color is then converted into the wavelength of light of a second color or light of a third color so as to achieve color conversion of light.

FIG. 1 is a schematic cross-sectional view showing a structure of a light-emitting device according to U.S. Pat. No. 5,998,925, in which a light-emitting component 15 (for example, an LED die) is sited inside a housing 13 filled with a filler such as epoxy resin 19 containing a fluorescent material surrounding the light-emitting component 15. The electrodes for the n-type side and the p-type side of the light-emitting component 15 are, respectively, connected via conducting wires 157 to metal pads 17 under the housing 13. The monochromatic light from the light-emitting component 15 is then converted by the epoxy resin 19 containing a fluorescent material into light of a wavelength different from the original. Certainly, when the light-emitting device is designed to emit light identical to that emitted by the light-emitting component 15, epoxy resin 19 without any fluorescent material is also provided as so to hold and protect the light-emitting device.

Even though the aforementioned prior art achieves light conversion so as to possibly realize a white light source, there are still some drawbacks as described below:

1. Heat generated during operation of the light-emitting device accumulates to adversely affect the light-emitting component due to lack of heat dissipation channel, resulting in poor reliability and shortened lifetime. For a micro-sized packaged device (such as surface mounted device, SMD), since the size of the device is very small after being packaged, the thermal effect thereof is much more severe than that of conventional packaged devices. Furthermore, because small-size high-power light-emitting devices are highly expected, the heat generated during operation of such light-emitting devices will be considered as a great challenge to the state-of-the-art packaging technology.

2. The thermal expansion coefficients of epoxy resin and generally used substrates differ significantly from that of a light-emitting component. When the temperature during operation (or the temperature difference between the light-emitting component and the environment outside of device) increases to a certain value, physical properties of the light-emitting component may change or the light-emitting component itself may fail due to interface stress, resulting in a shortened lifetime.

3. To reduce the fabrication cost, the conventional light-emitting device comprises epoxy resin directly surrounding the light-emitting component for the sake of positioning as well as protection. The filler such as epoxy resin may, to some extent, absorb light passing through the filler, which adversely affects the illumination quality. Meanwhile, the organic or inorganic filler suffers from poor reliability under illumination at short wavelengths (<450 nm), adversely affecting the illumination quality, illumination intensity, stability and lifetime of the light-emitting device.

4. Since the light-emitting component (for example, an LED die) is surrounded by epoxy resin, a stress on the light-emitting component may occur when the epoxy resin is solidified from its liquid state. Therefore, the illumination quality, device reliability and lifetime may be affected.

5. During the curing process for solidifying the epoxy resin, the stress on the light-emitting component may result in an open circuit by breaking up the conducting wires bonded between the light-emitting component and the pads. Therefore, the fabrication yield as well as the device reliability may be significantly reduced.

6. Since the epoxy resin is formed by injection into the housing, the precision is questionable. Furthermore, stress of considerable strength resulting from molding and curing process may reduce the device quality. If the customer requires only small amount of devices with a great diversity of patterns, conventional fabrication processing (which requires to use different molds) may increase the fabrication cost and take a much longer time.

7. The light-emitting component as well as the fluorescent material is likely to degrade due to short wavelength light such as UV light, leading to poor reliability and a shortened lifetime of the light-emitting device.

In other words, the heat generated on a micro-sized packaged device is over ten times the heat on a conventional packaged device since the state-of-the-art micro-sized packaging substrate has only a tenth time the area of a conventional packaging substrate. Meanwhile, as the device gets smaller (for example, the SMD is heading for 0402 from the 0603 spec.), the heat issue will become more and more critical.

The high-power light-emitting device is increasingly required in the market. However, the micro-sized packaged device suffers from poor heat dissipation resulting in poor reliability and a shortened lifetime under high-power applications. Considering a micro-sized high-power device, on which the heat generated per unit area is at least ten times the heat generated on a conventional packaged device and the current during operation is at least ten times the operation current in a conventional device, the heat dissipation ability is required to be at least one hundred times over a conventional one. Moreover, if the current during operation is further increased, the heat generated per unit area on the micro-sized packaged device will be very close to that of a sold-state laser, which is never considered in micro-sized packaging. In addition, stress due to thermal expansion difference between materials as well as packaging reliability may also additional problems.

Therefore, there is need in providing a light-emitting device with improved reliability, so as to achieve a prolonged lifetime, better stability and excellent illumination quality even though the device is used in an unfriendly environment.

SUMMARY OF THE INVENTION

Accordingly, it is the primary object of the present invention to provide a light-emitting device with improved reliability, in which, instead of epoxy resin, material with a thermal expansion coefficient equivalent to that of the light-emitting component is used as the cap and the substrate so as to be suitable for use in an unfriendly environment.

It is another object of the present invention to provide a light-emitting device with improved reliability, in which the substrate is formed of a material with high thermal conductivity so as to conduct the heat generated from the light-emitting component during operation to the surrounding environment, which ensures the device better illumination quality and a prolonged lifetime.

It is still another object of the present invention to provide a light-emitting device with improved reliability, in which there is no filler such as epoxy resin surrounding the light-emitting component. The problems in that the filler degrades due to short wavelength light, resulting in a shortened lifetime, and that the stress due to thermal expansion coefficient difference results in an open circuit by breaking up the conducting wires bonded between the light-emitting component and the pads are overcome. Therefore, the device lifetime is prolonged and the illumination quality is guaranteed.

It is still another object of the present invention to provide a light-emitting device with improved reliability, in which various kinds of caps are manufactured by using conventional semiconductor processing so as to achieve high precision and mass production within a shortened time.

It is still another object of the present invention to provide a light-emitting device with improved reliability, in which the substrate is selected from various kinds of materials so as to achieve easy fabrication and enlarge the scope of application.

It is still another object of the present invention to provide a light-emitting device with improved reliability, in which the light-emitting component is protected from short wavelength light from the surrounding environment and the short wavelength light generated from the light-emitting component is also prevented from traveling to the human body.

It is still another object of the present invention to provide a light-emitting device with improved reliability, in which the heat dissipation for a micro-sized high-power device, the stress on the light-emitting component and reliability can be improved. Meanwhile, the present invention is also suitable for use in a conventional micro-sized device so as to improve the operation efficiency, thermal stability and reliability because the present invention exhibits high-efficient heat dissipation and high reliability.

In order to achieve the foregoing objects, the present invention provides a light-emitting device with improved reliability, comprising: a substrate; a light-emitting component, having a p-n junction, mounted on the top surface of the substrate so as to be connected to corresponding metal pads through at least one conducting wire; and a cap, formed of a transparent material to have an inward concave, wherein the light-emitting component is disposed in the inward concave such that there is a gap between the light-emitting component and the cap.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing a light-emitting device with improved reliability can be exemplified by the preferred embodiments as described hereinafter.

Figure 1:
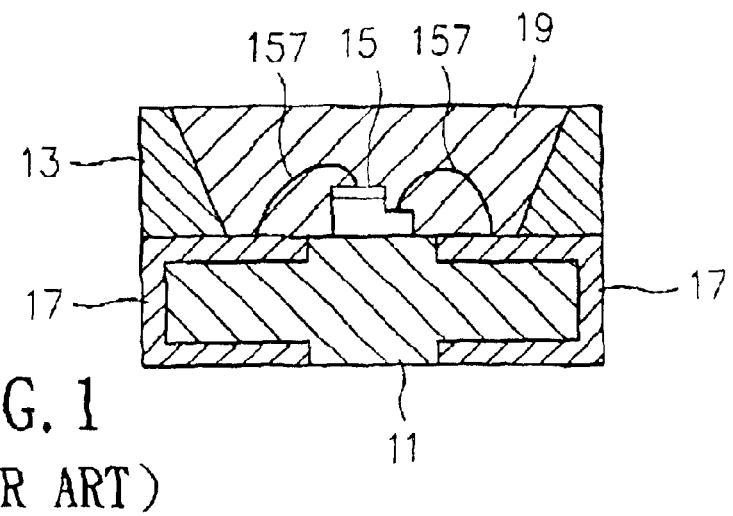
FIG. 1 is a cross-sectional view showing a light-emitting device in accordance with the prior art.
Figure 2A:
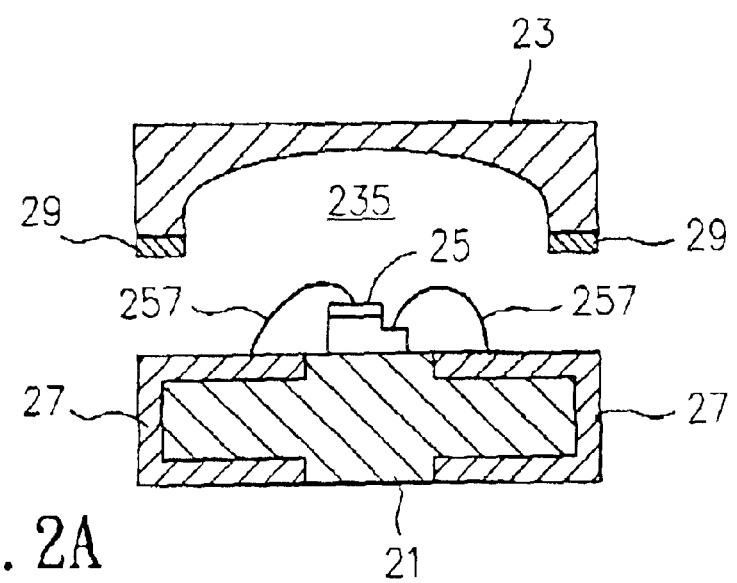
FIG. 2A is a decomposing cross-sectional view showing a light-emitting device in accordance with a preferred embodiment of the present invention.

Please refer to FIG. 2A, which is a decomposing cross-sectional view showing a light-emitting device in accordance with a preferred embodiment of the present invention. As shown in the figure, a light-emitting component (such as an LED die, an organic electroluminescent device (OELD), a laser diode (LD) and a vertical cavity surface-emitting laser (VCSEL)) 25, having a p-n junction, is mounted on the top surface of the substrate 21 having excellent thermal conductivity as well as the thermal expansion coefficient equivalent to that of the light-emitting component 25. The electrodes for the n-type side and the p-type side of the light-emitting component 25 are, respectively, connected via conducting wires 257 to metal pads 27 by the sides of the substrate 21.

Furthermore, semiconductor processing such as etching and photolithography is employed to form a cap 23 with an inward concave 235 by using a transparent material selected from a group containing glass, silica glass, quartz, $Al_2O_3$, SiC, ZnO, MgO, $MgZnO_2$, diamond, ITO (indium tin oxide) and combination thereof.

Then, the cap 23 is fixedly mounted via an adhesive layer 29 onto the substrate 21 or part of the surface of the metal pads 27. The inward concave 235 of the cap 23 contains the light-emitting component 25 on the substrate 21. Provided between the cap 23 and the light-emitting component 25 is a gap 237, in which there is no filler such as epoxy resin or any fluorescent material surrounding the light-emitting component 25, forming an "air-type" light-emitting device. In this manner, such an air-type light-emitting device is manufactured at a controllable cost, and thus the problems related to the prior art such as the stress, the open circuit and light intensity attenuation can be overcome, as shown in FIG. 2B.

Figure 2B:
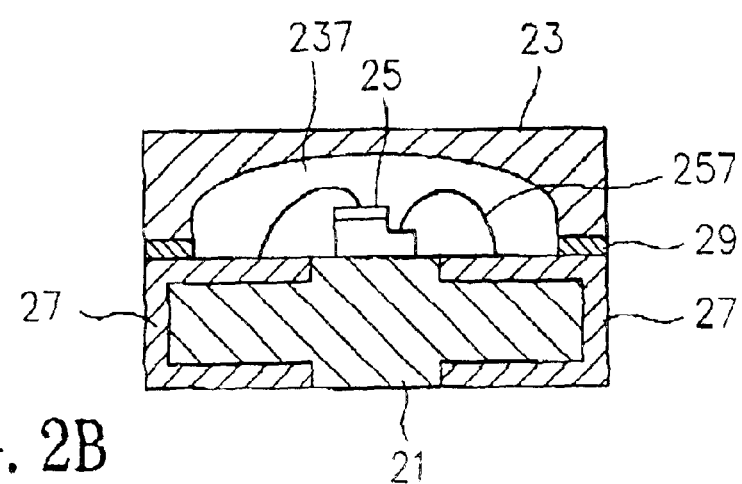
FIG. 2B is a cross-sectional view showing the light-emitting device of FIG. 2A.

In the preferred embodiment as shown in FIGS. 2A and 2B, the adhesive layer 29 is formed of a heat-resistant adhesive. Alternatively, materials containing heat-resistant alloys such as PbSn, AuSn, AuGe and SiAu can also be used as the adhesive layer 29 for fixedly mounting the cap 23 onto the substrate 21 at a high temperature. Certainly, the cap 23 can be heated to allow the glass material contained in the cap 23 to fuse with the substrate 21 or the metal pads 27 so as to complete an light-emitting device as shown in FIG. 2B.

Furthermore, in order to achieve better illumination quality as well as a prolonged lifetime of the light-emitting device even when it is used in an unfriendly environment, the substrate 21 is formed of a material with excellent thermal conductivity as well as a thermal expansion coefficient equivalent to that of the light-emitting component 25. For example, corundum, AlN, SiC, BeO, BN, AuSi, ITO, IZO, ZnO and $Al_2O_3$ are recommended.

Figure 3A:
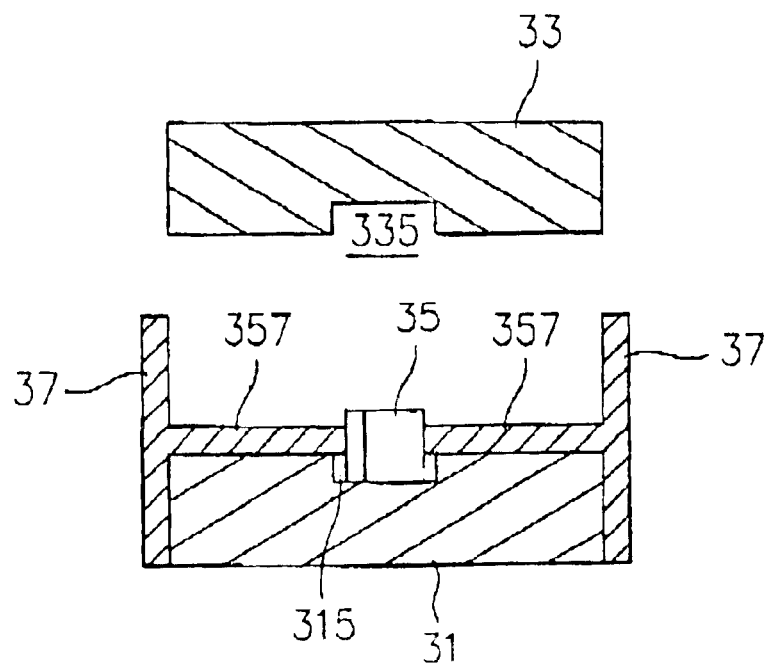
FIG. 3A is a decomposing cross-sectional view showing a light-emitting device in accordance with another embodiment of the present invention.
Figure 3B:
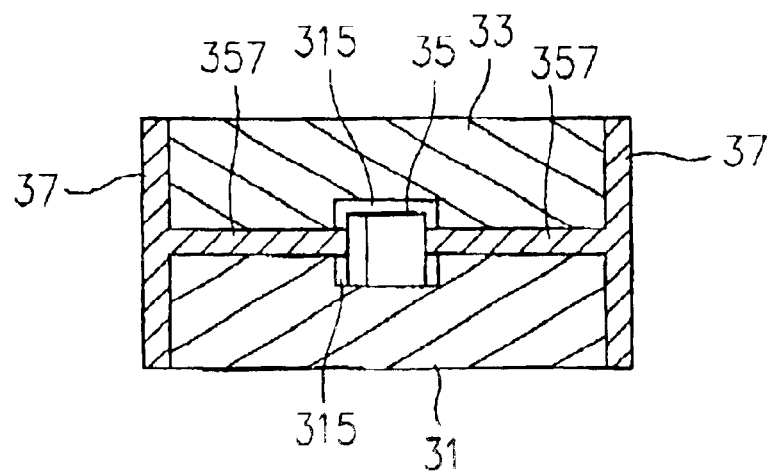
FIG. 3B is a cross-sectional view showing the light-emitting device of FIG. 3A.

Please further refer to FIGS. 3A and 3B, which are, respectively, a decomposing cross-sectional view and a completed cross-sectional view showing a light-emitting device in accordance with another embodiment of the present invention. In the figures, the present invention is characterized in that a surface-emitting light-emitting component instead of a planar light-emitting component in the aforementioned embodiment is used. The manufacturing processing of the present embodiment is similar to that of the aforementioned embodiment, more specifically, comprising steps of: (1) preparing a bottom portion including a substrate 31, an light-emitting component 35, conducting wires 357 and metal pads 37, as shown in FIG. 3A; (2) preparing a top portion including a cap 33 with a trench 335, as shown in FIG. 3A; (3) combining the bottom portion and the top portion to form a light-emitting device, as shown in FIG. 3B, having a gap between the cap 33 and the light-emitting component 35. The present embodiment is suitable for use in a SMD light-emitting device because the problems due to the filler such as epoxy resin can be prevented.

Figure 4:
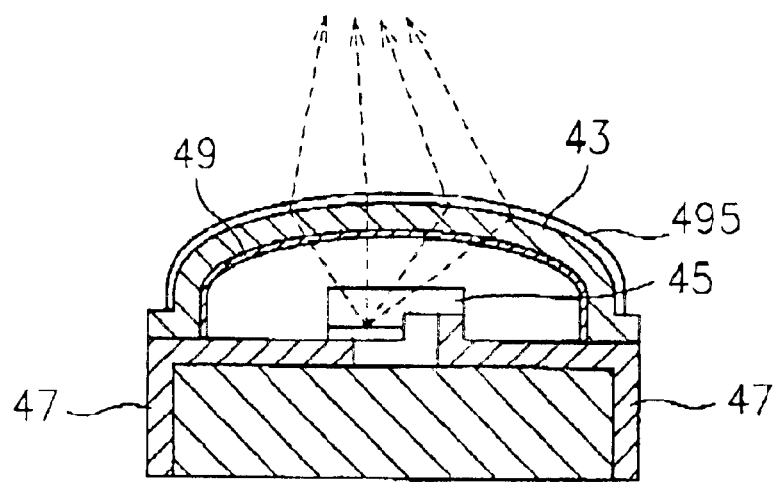
FIG. 4 is a cross-sectional view showing a light-emitting device in accordance with still another embodiment of the present invention.

Please further refer to FIG. 4, which is a cross-sectional view showing a light-emitting device in accordance with still another embodiment of the present invention. In FIG. 4, a planar light-emitting component 45 has a different structure from the aforementioned embodiment in FIG. 2A. The electrodes for the n-type side and the p-type side of the light-emitting component 45 are omitted since the light-emitting component 45 is formed directly contacting the metal pads 47. Therefore, the conducting wires are omitted in this case. Furthermore, in order to have the emitted light beams (shown as dotted arrows) more focused on a certain object according to practical use, the cap 43 is manufactured by using semiconductor processing after being optically designed to have an optimal shape, preferably a dome shape.

Moreover, a fluorescent material 49 for wavelength conversion can be coated on either surface of the cap 43 so as to achieve light of another color, even to emit white light.

Furthermore, an anti-UV material 495 for blocking light of a short wavelength can also be coated on either surface of the cap 43, such that the light-emitting component (such as an LED die, an organic electroluminescent device (OELD), a laser diode (LD) and a vertical cavity surface-emitting laser (VCSEL)) 45 will not degrade due to external UV light and the short wavelength light generated from the light-emitting component is also prevented from traveling to the human body.

Figure 5:
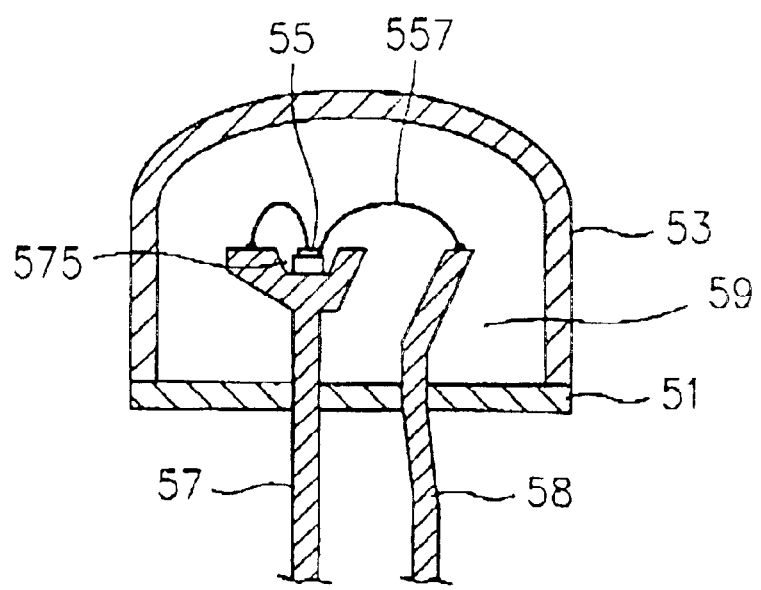
FIG. 5 is a cross-sectional view showing a light-emitting device in accordance with a further embodiment of the present invention.

The previous embodiments are suitable for use in SMD applications. However, the scope of the present invention is not limited to these embodiments. The disclosure of the present invention is also applicable to the lead-type light-emitting device. As shown in FIG. 5, a light-emitting component 55 is formed on a concave holder 575 on top of a first conducting column 57. The light-emitting component 55 is connected via at least a conducting wire 557 to the first conducting column 57 and a second conducting column 58. In the present embodiment, for the sake of positioning as well as protection of the light-emitting component, a bottom plate 51 is provided to be connected to the bottom portion of a cap 53, such that a chamber 59 is formed to contain the light-emitting component 55, part of the first conducting column 57 and part of the second conducting column 58. Since the bottom plate 51 in the present embodiment is formed of the same materials of the substrate in the aforementioned embodiments and there is no filler such as epoxy resin needed in the chamber 59, the light-emitting device thus fabricated is suitable for use in any unfriendly environment while possessing the same advantages as described above.

According to the above discussion, it is apparent that the present invention discloses a light-emitting device with improved reliability so as to achieve a prolonged lifetime, better stability and excellent illumination quality. Therefore, the present invention has been examined to be novel, unobvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A light-emitting device with improved reliability, comprising:
   a substrate;
   a light-emitting component, having a p-n junction, mounted on a top surface of said substrate, connected to corresponding metal pads through at least one conducting wire; and
   a cap, formed of a transparent material having a lower concave surface, wherein said light-emitting component is disposed in an inward concavity defined by said lower concave surface such that there is a gap between said light-emitting component and said cap, said cap being formed of said transparent material, said transparent material being selected from the group consisting of: glass, silica glass, quartz, $Al_2O_3$, SiC, ZnO, MgO, $MgZnO_2$, diamond, indium tin oxide (ITO) and combinations thereof.

2. The light-emitting device as recited in claim 1, wherein said cap is formed by using semiconductor processing to form said inward concavity.

3. The light-emitting device as recited in claim 1, wherein said cap has a dome shape.

4. The light-emitting device as recited in claim 1, wherein a fluorescent material is coated on said lower concave surface of said cap.

5. The light-emitting device as recited in claim 1, wherein an anti-UV material is coated on a surface of said cap.

6. The light-emitting device as recited in claim 1, wherein said substrate is formed of a material with high thermal conductivity as well as a thermal expansion coefficient equivalent to that of said light-emitting component.

7. The light-emitting device as recited in claim 6, wherein said substrate is formed of a material selected from the group containing corundum, AlN, SiC, BeO, BN, AuSi, ITO, IZO, ZnO, $Al_2O_3$ and combination thereof.

8. The light-emitting device as recited in claim 1, wherein said cap is connected via an adhesive layer to said top surface of said substrate.

9. The light-emitting device as recited in claim 8, wherein said adhesive layer is formed of a material selected from a sealing glue and an alloy.

10. The light-emitting device as recited in claim 9, wherein said alloy is formed of a material selected from a group containing PbSn, AuSn, AuGe, SiAu and combination thereof.

11. The light-emitting device as recited in claim 1, wherein said cap is heated to fuse with said top surface of said substrate.

12. The light-emitting device as recited in claim 1, wherein said light-emitting device is a surface-mounted device (SMD).

13. The light-emitting device as recited in claim 1, wherein said substrate is a first conducting column, on which is a concave holder for positioning said light-emitting component thereon such that said light-emitting component is connected via at least one conducting wire to said first conducting column and a second conducting column.

14. The light-emitting device as recited in claim 13, further comprising a bottom plate connected to the bottom portion of said cap such that a chamber is formed to contain said light-emitting component, part of said first conducting column and part of said second conducting column.

15. The light-emitting device as recited in claim 13, wherein said light-emitting device is a lead-type device.

* * * * *